US010054925B2

(12) United States Patent
Girardey

(10) Patent No.: US 10,054,925 B2
(45) Date of Patent: Aug. 21, 2018

(54) FIELD DEVICE FOR A SAFETY-CRITICAL APPLICATION WITH REDUNDANT MEASURING CHANNELS IN AN FPGA

(71) Applicant: Endress + Hauser GmbH + Co. KG, Maulburg (DE)

(72) Inventor: Romuald Girardey, Blotzheim (FR)

(73) Assignee: Endress + Hauser GmbH + Co. KG, Maulburg (DE)

(*) Notice: Subject to any disclaimer, the term of this patent is extended or adjusted under 35 U.S.C. 154(b) by 347 days.

(21) Appl. No.: 14/768,270

(22) PCT Filed: Jan. 24, 2014

(86) PCT No.: PCT/EP2014/051424
§ 371 (c)(1),
(2) Date: Aug. 17, 2015

(87) PCT Pub. No.: WO2014/124792
PCT Pub. Date: Aug. 21, 2014

(65) Prior Publication Data
US 2015/0378337 A1 Dec. 31, 2015

(30) Foreign Application Priority Data

Feb. 18, 2013 (DE) .................. 10 2013 101 579

(51) Int. Cl.
G05B 19/042 (2006.01)
G05B 9/03 (2006.01)
(Continued)

(52) U.S. Cl.
CPC .......... *G05B 19/0428* (2013.01); *G05B 9/03* (2013.01); *G05B 19/058* (2013.01);
(Continued)

(58) Field of Classification Search
CPC .............. G05B 19/0428; G05B 19/058; G05B 2219/21109; G05B 2219/25428;
(Continued)

(56) References Cited

U.S. PATENT DOCUMENTS 3,787,816 A * 1/1974 Hauck ................. G06F 11/2023
714/3
7,870,299 B1 1/2011 Sorensen et al.
(Continued)

FOREIGN PATENT DOCUMENTS

DE 102009026785 A1 8/2010
DE 102009028938 A1 3/2011
(Continued)

OTHER PUBLICATIONS

English Translation of International Preliminary Report on Patentability, WIPO, Geneva, dated Aug. 27, 2015.
(Continued)

*Primary Examiner* — Kenneth M Lo
*Assistant Examiner* — Chad Erdman
(74) *Attorney, Agent, or Firm* — Bacon & Thomas, PLLC

(57) ABSTRACT

A field device to determine or monitor a process variable in automation technology The field device meets a safety standard that is required in a given safety-critical application, with a sensor working according to a defined measuring principle, and a control/evaluation unit that processes and evaluates the measuring data delivered by the sensor in uninterrupted sensor measuring mode along at least three redundantly and/or diversely designed measuring channels. The control/evaluation unit has at least two redundant reconfiguration controls assigned to it, and with one of the two redundant reconfiguration controls dynamically or partially dynamically reconfiguring the faulty measuring channel in case of a malfunction in one of the measuring channels.

11 Claims, 2 Drawing Sheets

(51) Int. Cl.
  *G05B 19/05* (2006.01)
  *H03K 19/177* (2006.01)
(52) U.S. Cl.
  CPC ... *H03K 19/1776* (2013.01); *H03K 19/17728* (2013.01); *H03K 19/17756* (2013.01); *G05B 2219/21109* (2013.01); *G05B 2219/25428* (2013.01)
(58) Field of Classification Search
  CPC ............ G05B 9/03; H03K 19/17728; H03K 19/17756; H03K 19/1776
  See application file for complete search history.

(56) References Cited

U.S. PATENT DOCUMENTS

| | | | |
|---|---|---|---|
| 8,612,920 B2 | 12/2013 | Girardey et al. | |
| 8,712,727 B2 | 4/2014 | Girardey et al. | |
| 8,812,262 B2 | 8/2014 | Grittke et al. | |
| 2005/0057284 A1* | 3/2005 | Wodnicki | A61B 8/13 327/100 |
| 2005/0198102 A1* | 9/2005 | Hahn | G06F 9/44505 709/200 |
| 2005/0246520 A1* | 11/2005 | Vadi | H03K 19/17744 713/100 |
| 2006/0142954 A1 | 6/2006 | Muller et al. | |
| 2011/0087460 A1* | 4/2011 | Girardey | G05B 9/02 702/182 |
| 2012/0004860 A1* | 1/2012 | Girardey | G05B 9/03 702/22 |
| 2013/0299642 A1* | 11/2013 | Eickhoff | B64G 1/24 244/172.7 |

FOREIGN PATENT DOCUMENTS

| | | |
|---|---|---|
| DE | 102010002346 A1 | 4/2011 |
| DE | 102010043706 A1 | 1/2012 |
| WO | 2004013585 A1 | 2/2004 |
| WO | 2009062954 A1 | 5/2009 |
| WO | 2010086073 A1 | 8/2010 |

OTHER PUBLICATIONS

International Search Report EPO, The Netherlands, dated Jul. 16, 2014.

German Search Report, German PTO, Munich, dated Oct. 1, 2013.

\* cited by examiner

FIELD DEVICE FOR A SAFETY-CRITICAL APPLICATION WITH REDUNDANT MEASURING CHANNELS IN AN FPGA

TECHNICAL FIELD

The invention concerns a field device for determining or monitoring a process variable in automation technology, with the field device satisfying a safety standard that is required in a set safety-critical application, with a sensor working according to a defined measuring principle and a control/evaluation unit that processes and evaluates the measuring data provided by the sensor along at least three redundant and/or diversely organized measuring channels in measuring mode. A corresponding solution is known from published international patent application WO 2004/013585 A1.

BACKGROUND DISCUSSION

In automation technology, especially in process automation technology, field devices are used that serve to determine and monitor process variables. Examples of such field devices are fill level meters, flow meters, analytical meters, pressure and temperature meters, humidity and conductivity meters, and density and viscosity meters. The sensors in such field devices capture the relevant process variables, e.g. the fill level, flow, pH value, substance concentration, pressure, temperature, humidity, conductivity, density or viscosity.

The term "field devices" in the scope of this invention also includes actuators, e.g. valves or pumps, which for example serve to modify the flow of a liquid in a pipe, or the fill level in a container. The company group Endress+Hauser offers and distributes a large variety of such field devices.

Generally, field devices in modern automation technology plants are linked to a higher-level unit via communication networks such as HART multidrop, point-to-point connections, Profibus, and Foundation Fieldbus, the higher-level unit being referred to as control systems or control centers. This higher-level unit is used for process control, process visualization, process monitoring and for start-up and operation of the field devices. Additional components needed for the operation of fieldbus systems that are directly connected to a fieldbus and are in particular used for communication with the higher-level units are also often referred to as field devices. Such additional components usually are e.g. remote I/Os, gateways, linking devices, controllers or wireless adapters.

Depending on the application, the field devices must meet very different safety requirements. In order to meet the respective safety requirements, e.g. IEC61508 (SIL (safety integrity level) standard), the field devices must be designed redundantly and/or diversely.

Redundancy means increased safety due to the double or multiple design of any safety-relevant hardware and software components. Diversity means that the hardware components, e.g. a micro-processor, used for the various measuring channels are made by different manufacturers and/or are of a different type. For software components, diversity requires that the software saved in the micro-processors comes from different sources, i.e. from different manufacturers and/or programmers. All those measures are designed to ensure that a safety-critical failure of the field devices as well as simultaneously-occurring systematic errors in the provision of measuring values is excluded with a high probability.

One example of a safety-relevant application is the fill level control in a tank which contains a flammable or a non-flammable but water-polluting substance. In such a case, it must be ensured that the feeding of liquid into the tank is immediately interrupted as soon as the maximum acceptable fill level is reached. This in turn requires that the measuring device detects the fill level with a high level of reliability and works without errors.

For the solutions already known, the measuring channel is designed redundantly and/or diversely, but the voter, usually a micro-processor, represents the Achilles heel of a field device that is to satisfy high and maximum safety requirements. The micro-processor is designed monolithically. If any dangerous error (according to the nomenclature of the above-mentioned standards) occurs, the field device fails. In order to satisfy the requirements of SIL 3, the percentage of dangerous errors of the total of all possible errors may reach a maximum of one percent. This safety level cannot be reached using a traditional micro-processor.

In order to solve this problem, a field device is described in DE 102012106 652.3 (published international application WO 2014/124792 A1), whose voter is designed as a majority voter and comprises three stages:
- a comparator stage which compares the output signals provided by the individual measuring channels;
- an error recognition stage which recognizes errors occurring in a measuring channel by suitably linking the output signals from the comparator stage, and
- an output selection stage.

The content of DE 10 2012 106 652.3 (WO 2014/124792 A1), especially with regard to its reference to the voter, is to be considered included in the subject matter disclosed within this present patent application. Furthermore, WO 2014/124792 A1, DE 10 2013 100159.9, discloses a field device that satisfied the high safety levels even in the area of the current output module, e.g. in a 4-20 mA two or four wire field device. The corresponding disclosed content should also be considered part of the content of this patent application.

If a malfunction in one of the measuring channels occurs, such a malfunction is rectified by a reconfiguration control that reconfigures the faulty measuring channel. However, if the malfunction occurs in the reconfiguration control itself, correct reconfiguration processes can no longer be ensured once a malfunction occurs in one of the measuring channels.

SUMMARY OF THE INVENTION

The invention is based on the object of providing a field device that is characterized by improved functional safety.

This object is achieved by assigning at least two redundant reconfiguration controls to the control/evaluation unit of the field device according to the invention, with one of the two redundant reconfiguration controls reconfiguring the faulty measuring channel dynamically or partially dynamically if a malfunction occurs in one of the measuring channels. The solution according to the invention increases the functional safety of the field device, especially if the measuring channels and the voter are designed redundantly and/or diversely in addition to the reconfiguration controls. As mentioned before, the safe voter has been described in DE 10 2012 106 652.3, (WO 2014/124792 A1).

In an advantageous embodiment of the field device according to the invention, two digital measuring channels and the two reconfiguration controls are arranged on a dynamically reconfigurable FPGA chip that consists of a plurality of configurable logic blocks, so-called CLB— configurable logic blocks—which are arranged in a mainly right-angled matrix consisting of columns and rows. This structure of the FPGA chip is allocated by the manufacturer.

If the FPGA chip is designed in such a way that the smallest configurable or reconfigurable unit are the configurable logic blocks arranged in one column, the configurable logic blocks arranged in one column may only be reconfigured together. One example of an FPGA chip with such a design is the Spartan 3E FPGA.

Furthermore, provision is made in the context of the field device according to the invention for the configurable logic blocks of the FPGA to be subdivided into four sub-groups that are mainly arranged symmetrically relative to each other, with two digital measuring channels arranged in the first sub-area and in the second sub-area, and with the two redundant reconfiguration controls arranged in the third sub-area and in the fourth sub-area. Together with this preferred arrangement, each column thus contains both logic blocks that are assigned to one of the digital measuring channels, and logic blocks that are assigned to one of the reconfiguration controls.

Consequently, the first sub-area with the first digital measuring channel and the third sub-area with the first reconfiguration control may only be configured or reconfigured together. Similarly, the second sub-area with the second digital measuring channel and the fourth sub-area with the second reconfiguration control may only be configured or reconfigured together.

One preferred embodiment of the field device according to the invention is constructed in such a way that, in case of a malfunction in one of the two digital measuring channels, the control/evaluation unit is designed such that the reconfiguration control that is assigned to the measurement channel that is working correctly will take over the reconfiguration of the faulty measuring channel and the associated reconfiguration control.

The preferred arrangement of the sub-areas allows for a mutual monitoring of the two redundant reconfiguration controls.

According to an advantageous further development of the field device according to the invention, there is a third measuring channel which is configured in an FPAA on an analog basis, with the third measuring channel being reconfigured via one of the two redundant reconfiguration controls if a malfunction occurs.

It is especially advantageous in connection with the field device according to the invention if the first reconfiguration control is allocated a first memory unit and the second reconfiguration control a second memory unit. In this case, at least the reconfiguration data of the second measuring channel and the second reconfiguration control are saved in the memory unit allocated to the first reconfiguration control, while the second memory unit allocated to the second reconfiguration control saves at least the reconfiguration data of the first measuring channel and the first reconfiguration control.

This design allows each of the two reconfiguration controls to execute two diagnostic functions. The two diagnostic functions ensure that the reconfiguration process is completed correctly and with the high safety level required. In the following, the two diagnostic functions are explained in more detail:

a) In the first diagnostic function, each of the two reconfiguration controls executes a CRC check of the memory unit assigned to the other reconfiguration control. The memory unit is preferably a flash memory unit in which the reconfiguration data are saved.

b) Each reconfiguration control monitors the correct execution of the reconfiguration process executed by the other reconfiguration control. For this purpose, the configuration data of the respective sub-areas on the FPGA chip and, if applicable, the FPAA are read back and compared to the corresponding saved reconfiguration data in the memory unit assigned to the reconfiguration control that is not reconfigured. The FPGA chips SPARTAN 3E and ANADIGM Vortex AN221E04 have, for example, such a read-back function. The diagnostic function described above is preferably executed after every reconfiguration process—i.e., event-driven.

It is self-evident that the diagnosis may also be executed in set regular or irregular intervals. If the check has a negative result, the monitoring function initiates another reconfiguration of the sub-areas that have been incorrectly configured. Alternatively, an alarm may be triggered.

In addition, it is proposed that there are reconfiguration data of the third measuring channel saved in both memory units, the third measuring channel preferably being configured on an analog basis in one or more FPAAs. For example, four FPAAs are used for measuring channel MK3. This allows both reconfiguration controls to reconfigure the analog-based measuring channel in case of a malfunction.

In order to comply with a set safety standard—especially in this case the standard IEC61508—it is proposed to space the individual sub-areas of the FPGA from each other by at least one prohibited area in such a way that a change in the temperature and/or voltage in a sub-area does not have any safety-critical influence on one of the neighboring sub-areas.

One advantageous embodiment of the field device according to the invention is that the reconfiguration controls check in set or event-driven intervals in measuring mode whether the reconfiguration data saved in the respective memory units correspond to the current configuration data used for the configuration of the respective sub-areas. In addition in measuring mode, each reconfiguration control checks in set or event-driven intervals whether the reconfiguration data saved in the memory unit assigned to the respective other reconfiguration control are correct.

In one advantageous embodiment of the field device according to the invention, the FPGA and the FPAA each have one configuration interface assigned to them which allows for the reconfiguration of the respective sub-areas of the FPGA and/or at least one FPAA in case of a malfunction. In this context, a control unit is furthermore provided to allow the reconfiguration control to access the configuration interface(s) of the FPGA and/or the FPAA.

BRIEF DESCRIPTION OF THE DRAWINGS

The invention will be further explained with reference to the following figures. In the figures.

DETAILED DISCUSSION IN CONJUNCTION WITH THE DRAWINGS

Figure 1:
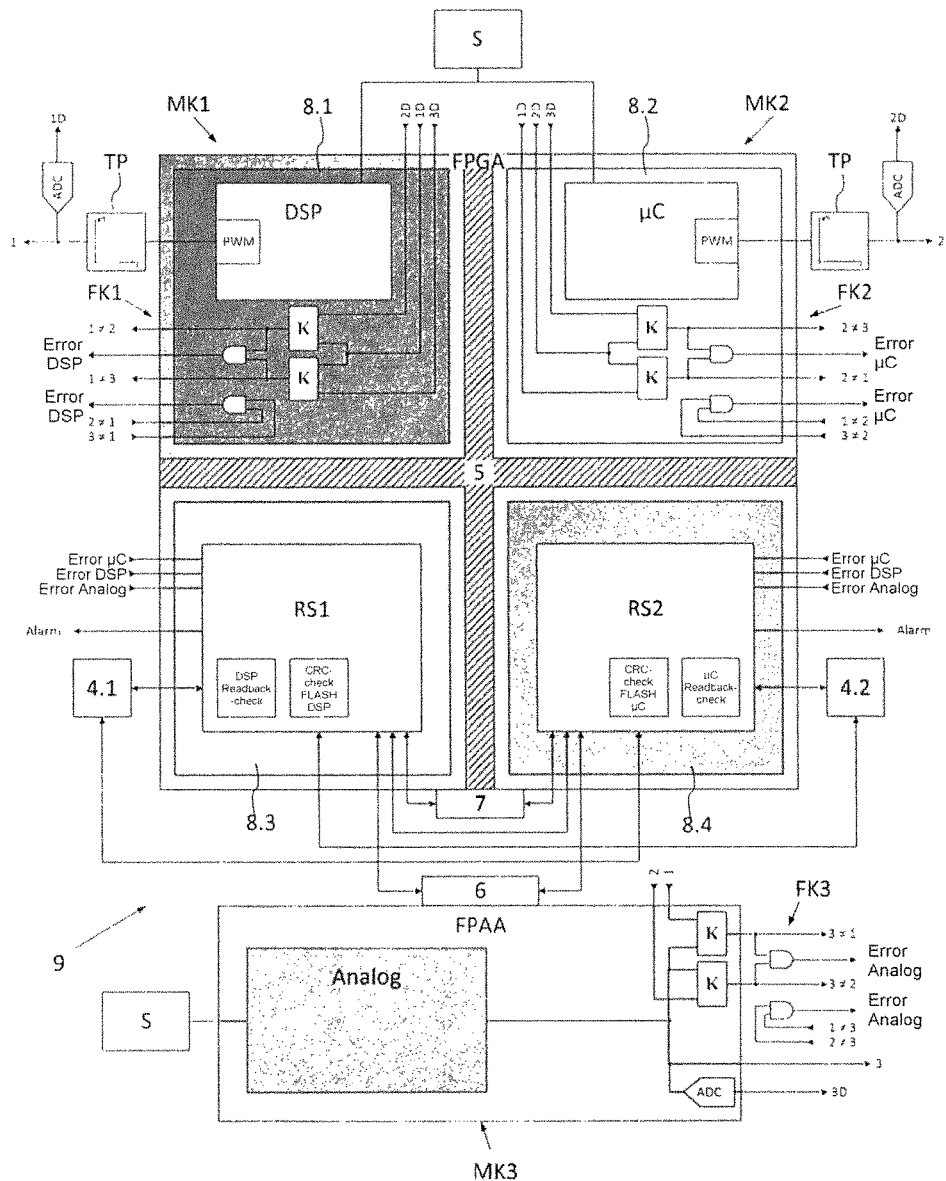
FIG. 1: shows a schematic representation of a preferred embodiment of the control/evaluation unit of the field device according to the invention.

FIG. 1 shows a schematic representation of a preferred embodiment of the control/evaluation unit 9 of the field device according to the invention. The field device consists of a sensor S and a control/evaluation unit 9. The control/evaluation unit 9 has three redundant and/or diverse measuring channels MK1, MK2, MK3 used to process and evaluate the measuring data provided by the sensor in measuring mode. The portrayed case shows the first measuring channel MK1 and the second measuring channel MK2 realized as digital measuring channels MK1, MK2 on an FPGA chip FPGA, while the third measuring channel MK3 is an analog measuring channel FPAA. At least two redundant reconfiguration controls RS are assigned to the control/evaluation unit 9, with one of the two redundant reconfiguration controls RS reconfiguring a faulty measuring channel MK dynamically or partially dynamically if a malfunction occurs in one of the measuring channels MK.

The control/evaluation unit 9 has a safe voter assigned to it as described in the above-mentioned (WO 2014/124792 A1) DE 10 2012 106 652.3. There are two basic options of implementing a safe voter in a field device that is to comply with a given safety standard: Either the safe voter is at least partially integrated into control/evaluation unit 9, or the safe voter is an integral part of a safe current output module as described in the above-mentioned DE 10 2013 100159.9 (WO 2014/124792 A1).

FIG. 1 illustrates a case in which the safe voter is implemented in the control/evaluation unit 9 with at least individual components of the safe voter directly integrated in the measuring channels MK1, MK2, MK3. Each measuring channel MK1, MK2, MK3 in particular contains two comparators K that compare the output signals 1, 2, 3 of the individual redundant and/or diverse measuring channels MK1, MK2, MK3 with each other. The output signals 3 used for the comparison via the comparators K are analog output signals 3 which are forwarded to the current output module not separately represented in FIG. 1. If the digital output signals 1, 2 are from the digital measuring channels MK1, MK2, they are generated by a pulse width modulator PMW, filtered by a low-pass filter TP and forwarded to the current output module not separately represented. The output signals 3 of the analog measuring channel MK3 are already available in analog form, thus eliminating the need for conversion. The analog output signals 1, 2, 3 are digitalized via internal or external analog-to-digital converters ADCs and passed on as digital output signals 1D, 2D, 3D to the comparators K of the first and second measuring channels MK1, MK2.

The output signals 1, 2, 3 of the comparators K are passed on to the error recognition stages FK. While the error recognition stages FK1, FK2 are integrated into the respective measuring channels MK1, MK2, the error recognition stage FK3 of the analog measuring channel MK3 is positioned outside the FPAA. The reason for this arrangement is that an AND gate cannot be integrated into the FPAA. There are always two error recognition stages FK assigned to each of the measuring channels MK1, MK2, MK3. One of the error recognition stages FK always monitors the output signals of the comparators K assigned to the respective measuring channel MK while the other error recognition stage FK monitors the comparators K of the two other measuring channels MK.

The simply designed selection stage assigned to the safe voter and not separately represented in FIG. 1 is also arranged outside the FPGA chip FPGA since it belongs to each of the measuring channels MK. Please refer to DE 102012106652.3 (WO 2014/124792 A1) for more information about the selection stage.

If a malfunction is detected in one of the measuring channels MK or in one of the reconfiguration controls RS, this information is passed on to the correctly working reconfiguration control RS which proceeds to reconfigure the malfunctioning sub-areas 8.

Figure 2:
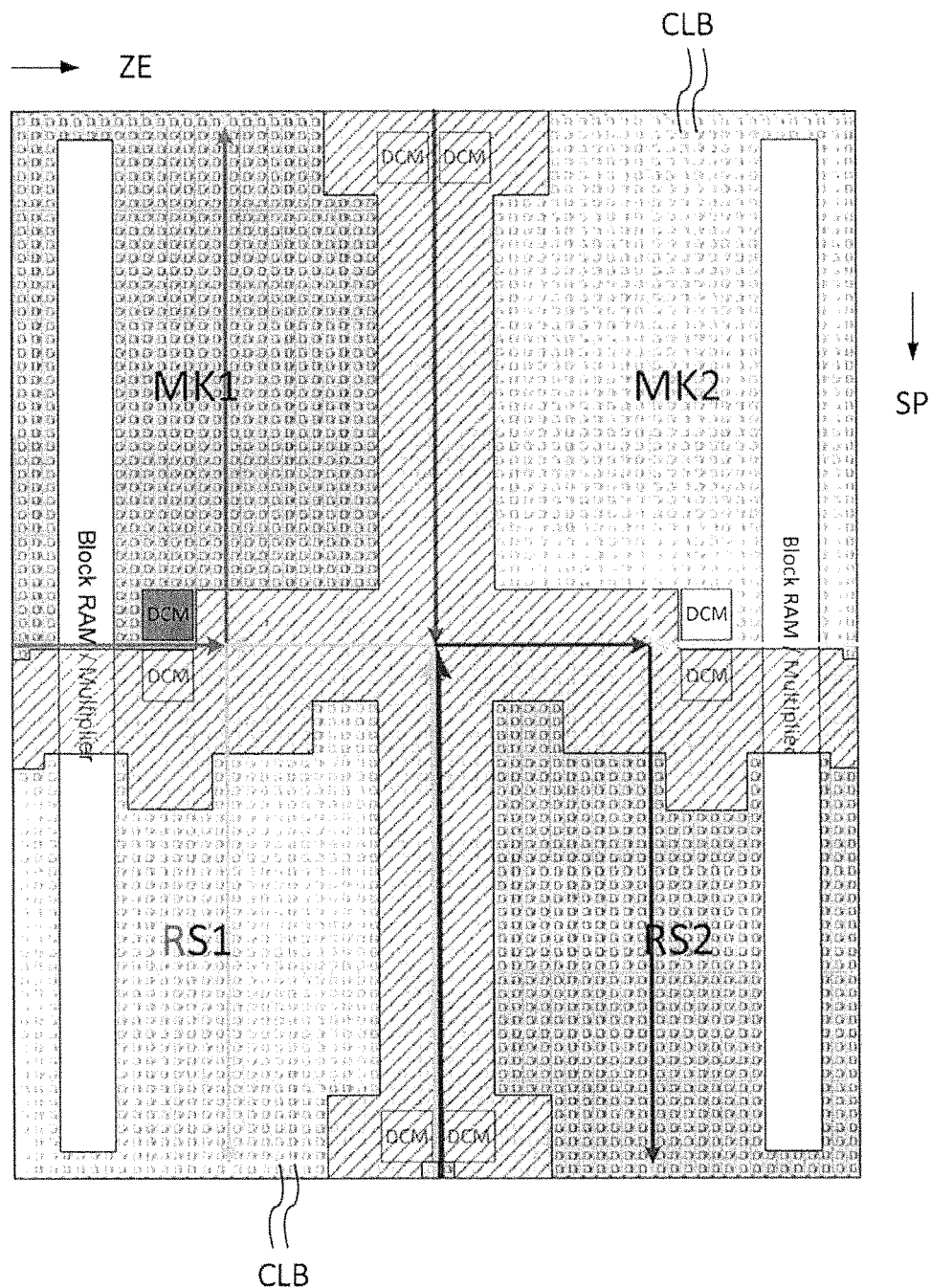
FIG. 2: shows a preferred embodiment of the FPGA on which the control/evaluation unit of the field device according to the invention is arranged.

For the following discussions, it is useful to include the representation of the FPGA chip FPGA in FIG. 2 in addition to the representation in FIG. 1: According to the invention, at least two digital measuring channels MK1, MK2 and the two redundant reconfiguration controls RS1, RS2 are arranged on a dynamically reconfigurable FPGA chip FPGA. The first digital measuring channel MK1 has a DSP allocated to it, while the second digital measuring channel MK2 has a micro-controller allocated to it. The FPGA chip FPGA consists of a plurality of configurable logic blocks CLB. Such configurable logic blocks CLB are arranged in a mainly right-angled matrix consisting of the columns SP and rows ZE.

The FPGA chip FPGA is designed in such a manner that the smallest configurable and reconfigurable unit are the configurable logic blocks CLB arranged in one column SP. The configurable logic blocks CLB of the FPGA chip FPGA are divided into four sub-groups 3 which are mainly symmetrical to each other. There are two digital measuring channels MK1, MK2 arranged in the first sub-area 8.1 and the second sub-area 8.2, while the two reconfiguration controls RS1, RS2 are arranged in the third sub-area 8.3 and the fourth sub-area 8.4. The individual sub-areas 8 of the FPGA chip FPGA are spaced from each other by a prohibited area 5 in such a way that a change in the temperature and/or voltage in a sub-area 8 does/do not have any safety-critical influence on one of the neighboring sub-areas 8.

Due to this preferred arrangement and due to the fact that the reconfiguration of the configurable logic blocks CLB is only possible in columns, the first sub-area 8.1 can only be reconfigured together with the first digital measuring channel MK1, and the third sub-area 8.3 together with the first reconfiguration control RS1. At the same time, both sub-areas 8.2, 8.4 may only be reconfigured together if a malfunction occurs in the second sub-area 8.2 with the second measuring channel MK2 or in the fourth sub-area 8.4 with the second reconfiguration control RS2.

If a malfunction occurs in one of the two digital measuring channels MK1, MK2, the respective reconfiguration control RS1; RS2 allocated to the correctly working measuring channel MK1; MK2 proceeds to reconfigure the faulty measuring channel MK1; MK2 and the associated reconfiguration control RS1; RS2. If the malfunction occurs in the third measuring channel MK3 which is configured in the case illustrated on an analog basis in one or more—preferably four—FPAAs, the dynamic or the dynamic partial reconfiguration is taken over by one of the two redundant reconfiguration controls RS1, RS2. The configuration interface 7 allocated to the FPGA chip FPGA is used to reconfigure the respective sub-areas 8 of the FPGA chip FPGA if a malfunction occurs. In case of a malfunction in the FPAA, access of the reconfiguration control RS is effected via the configuration interface 6. Access of the reconfiguration controls RS1, RS2 to the reconfiguration interfaces 6, 7 is controlled by a control that is an integral part of the respective reconfiguration controls RS1, RS2. During access of a reconfiguration control RS1, RS2 to the reconfiguration interface 6, 7, access is blocked for the respective other reconfiguration control RS1, RS2.

For safety by redundancy, the first reconfiguration control RS1 has a first memory unit 4.1 allocated to it, and the second reconfiguration control RS2 has a second memory unit 4.2 allocated to it. The first memory unit 4.1 allocated to the first reconfiguration control RS1 saves at least the reconfiguration data of the second measuring channel MK2 and the second reconfiguration control RS2. Furthermore, the reconfiguration data of the analog-based measuring channel MK3 is saved here. The second memory unit 4.2 allocated to the second reconfiguration control RS2 saves at least the reconfiguration data of the first measuring channel MK1 and the first reconfiguration control RS1. The reconfiguration data of the third measuring channel MK3 is saved here as well.

According to a first diagnostic function, the reconfiguration controls RS check during normal measuring mode in set or event-driven intervals whether the reconfiguration data saved in the associated memory units 4 correspond to the current configuration data used for the configuration of the respective sub-areas 8. In case of deviations, the faulty areas are reconfigured.

According to a second diagnostic function, each of the two redundant reconfiguration controls RS are checked in set or event-driven intervals in measuring mode. In particular, it is monitored whether the reconfiguration data saved in the memory unit 4 assigned to the respective other reconfiguration control RS is correct.

a) In the first diagnostic function, each of the two reconfiguration controls executes a CRC check of the memory unit assigned to the other reconfiguration control.

b) The second diagnostic function ensures that each reconfiguration control RS monitors the correct execution of the reconfiguration process executed by the respective other reconfiguration control. For this purpose, the configuration data of the respective sub-areas 8 on the FPGA chip and, if applicable, the FPAA is read back and compared to the corresponding saved reconfiguration data in the memory unit 4 assigned to the reconfiguration control RS that is not reconfigured. The diagnostic function described above is preferably executed after every reconfiguration process—i.e., event-driven. It is self-evident that the diagnosis may also be executed in set regular or irregular intervals. If the check has a negative result, the monitoring function initiates another reconfiguration of the sub-areas that have been incorrectly reconfigured. Alternatively, an alarm may be triggered.

The invention claimed is:

1. A field device to determine or monitor a process variable in automation technology, with the field device meeting safety standards required by a set safety-critical application, comprising:
   a sensor working according to a defined measuring principle;
   a control/evaluation unit that processes and evaluates the measuring data provided by said sensor along at least three redundant and/or diverse measuring channels in an uninterrupted measuring operation of said sensor;
   and at least two redundant reconfiguration controls assigned to said control/evaluation unit, wherein:
   one of said redundant reconfiguration controls reconfigures a faulty
   measuring channel of said redundant and/or diverse measuring channels dynamically or partially dynamically if a malfunction occurs in one of said redundant and/or diverse measuring channels;
       two digital measuring channels are provided and said two reconfiguration controls are arranged on a dynamically FPGA chip (FPGA) which consists of a plurality of configurable logic blocks arranged in a mainly right-angled matrix consisting of columns and rows;
   said reconfigurable logic blocks of the FPGA chip are divided into four sub-groups which are mainly arranged symmetrically to each other, with a first sub-area and a second sub-area having said two digital measuring channels arranged in them, and a third sub-area and a fourth sub-area having said two reconfiguration controls arranged in them;
   said first sub-area with said first digital measuring channel and said third sub-area with said first reconfiguration control are arranged relative to each other in such a way that they are reconfigured jointly; and
   said second sub-area with said second digital measuring channel and said fourth sub-area with said second reconfiguration control are arranged relative to each other in such a way that they are reconfigured jointly.

2. The field device according to claim 1,
wherein:
said FPGA chip (FPGA) is designed in such a manner that the smallest configurable and reconfigurable unit are said reconfigurable logic blocks arranged in one column.

3. The field device according to claim 1, wherein:
said control/evaluation unit is designed in such a way that, if a malfunction occurs in one of said two digital measuring channels, said reconfiguration control allocated to said correctly working measuring channel proceeds to reconfigure the faulty measuring channel and the associated reconfiguration control.

4. The field device according to claim 1, wherein:
a third measuring channel is provided that is configured on an analog basis in an FPA; and wherein:
said third measuring channel is reconfigured via one of said redundant reconfiguration controls if a malfunction occurs.

5. The field device according to claim 1, wherein:
said first reconfiguration control has a first memory unit assigned to it;
said second reconfiguration control has a second memory unit assigned to it;
said first memory unit allocated to said first reconfiguration control saves at least the reconfiguration data of said second measuring channel and said second reconfiguration control; and
said second memory unit allocated to said second reconfiguration control saves at least the reconfiguration data of said first measuring channel and said first reconfiguration control.

6. The field device according to claim 5, wherein:
the reconfiguration data of said third measuring channel that is preferably configured on an analog basis in one or more FPAAs (FPAA) being saved in both memory units.

7. The field device according to claim 1, wherein:
the individual sub-areas of the FPGA chips (FPGA) are spaced from each other by a prohibited area in such a way that a change in the temperature and/or voltage in a sub-area does not have any safety-critical influence on one of the neighboring sub-areas.

8. The field device according to claim 1, wherein:
said reconfiguration controls checks during a normal measuring mode in set or event-driven intervals whether the reconfiguration data saved in the respective memory units correspond to the current configuration data used for the configuration of the respective sub-areas.

9. The field device according to claim 1, wherein:
each reconfiguration control checks in a measuring mode in set or event-driven intervals whether the reconfiguration data saved in said memory unit assigned to the respective other reconfiguration control are correct.

10. The field device according to claim 1, wherein:
the FPGA chip (FPGA) is allocated a configuration interface and each FPAA (FPAA) being allocated a configuration interface which serve(s) to reconfigure the respective sub-areas of the FPGA chip (FPGA) or at least one FPAA (FPAA) in case of a malfunction.

11. The field device according to claim 10, further comprising:
a control unit that controls the access of said reconfiguration controls to said configuration interfaces of the FPGA chip (FPGA) and/or the FPAA (FPAA).

* * * * *